United States Patent [19]

Mitchell

[11] 4,235,301

[45] Nov. 25, 1980

[54] FOLDED COLUMN SPEAKER ENCLOSURE

[76] Inventor: Robert W. Mitchell, 707 Myrtle Ave., Saint Joseph, Mich. 49085

[21] Appl. No.: 45,337

[22] Filed: Jun. 4, 1979

[51] Int. Cl.³ .............................................. H05K 5/00

[52] U.S. Cl. .................................... 181/148; 181/152; 181/156; 181/199

[58] Field of Search ................................ 181/148-156, 181/187-191, 194-195, 199; 179/1 E

[56] References Cited

U.S. PATENT DOCUMENTS

| | | | |
|---|---|---|---|
| 2,476,572 | 7/1949 | Wenzel | 181/148 |
| 2,491,982 | 12/1949 | Kincart | 181/156 |
| 2,646,852 | 7/1953 | Forrester | 181/156 |
| 2,822,884 | 2/1958 | Simpson | 181/156 |
| 3,186,509 | 6/1965 | Dudognon | 181/155 |
| 3,235,028 | 2/1966 | Quinion | 181/154 |
| 3,241,631 | 3/1966 | Manieri | 181/147 |
| 3,608,665 | 9/1971 | Drisi | 181/150 |
| 3,627,948 | 12/1971 | Nichols | 179/1 E |
| 3,816,672 | 6/1974 | Gejvert et al. | 179/115.5 R |
| 4,168,761 | 9/1979 | Pappanikolson | 181/156 |

OTHER PUBLICATIONS

A. R. Bailey, "*The Transmission-line Loudspeaker Enclosure*", Wireless World 215 (May 1972).

G. L. Augspurger, "Column Loudspeaker Systems", Electronics World 25 (Jun. 1963).

*Primary Examiner*—Richard A. Wintercorn

*Assistant Examiner*—Benjamin R. Fuller

*Attorney, Agent, or Firm*—Neuman, Williams, Anderson & Olson

[57] ABSTRACT

A loudspeaker enclosure for housing a basic speaker and providing a conduit for channeling the sound waves emitted from the back surface of the basic speaker so that the sound waves are shifted in phase and emerge from a port in the enclosure and add to, rather than acoustically cancel, the sound waves emitted from the front surface of the basic speaker. The sound waves from the back surface of the speaker travel through the length of the conduit which is folded through several 45° angles upon itself. These sound waves are directed through the conduit by striking and reflecting from a plurality of at least six reflector panels which are mounted at 45° angles. In this manner, due to the nature of reflections at 45° angles, each portion of a sound wave impulse travels the same distance as each other portion and the impulse emerges from the port basically intact. The enclosure has a unique shape because of the several foldings of the conduit through 45° angles. This unique shape enables the enclosure to comprise significantly less volume than a comparable conventional column enclosure necessary to obtain the same degree of sound wave phase shifting. This shape also enables the listener to position one or more such enclosures in numerous attitudes and configurations according to the listener's preferences in room decor and in sound blend and coverage.

9 Claims, 15 Drawing Figures

FIG. 1
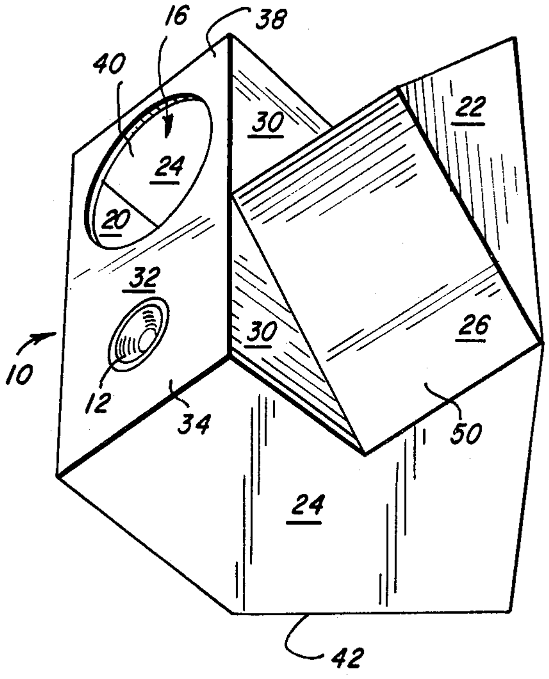
FIG. 2
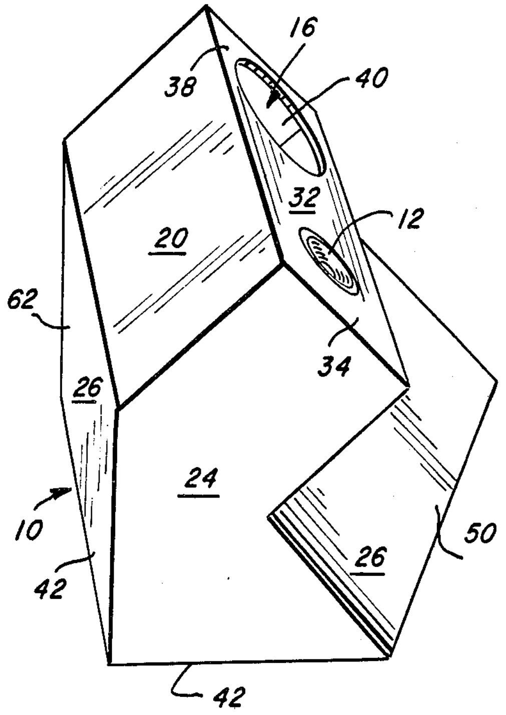
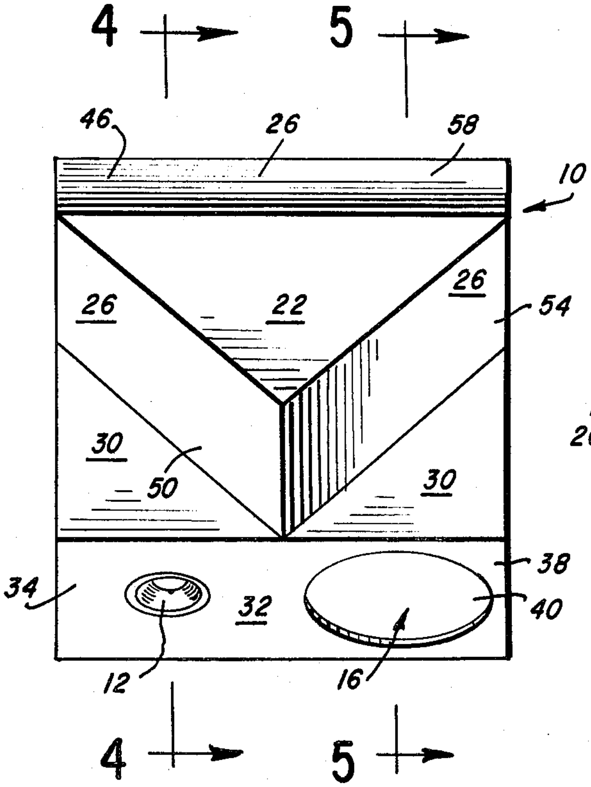
FIG. 3
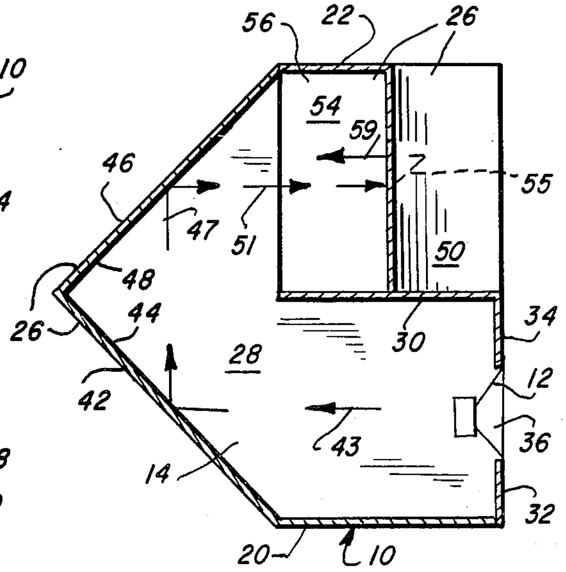
FIG. 4

FIG. 5
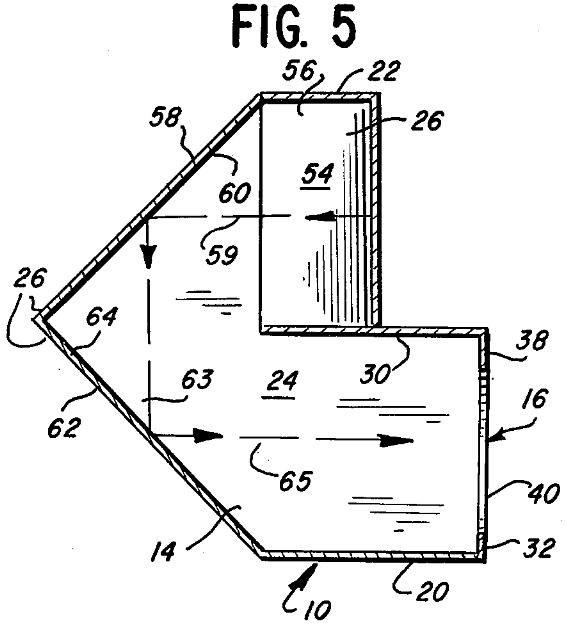
FIG. 6
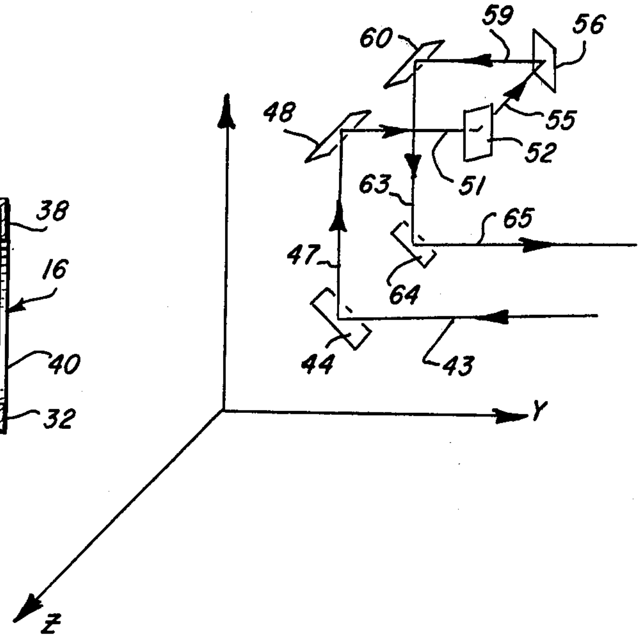
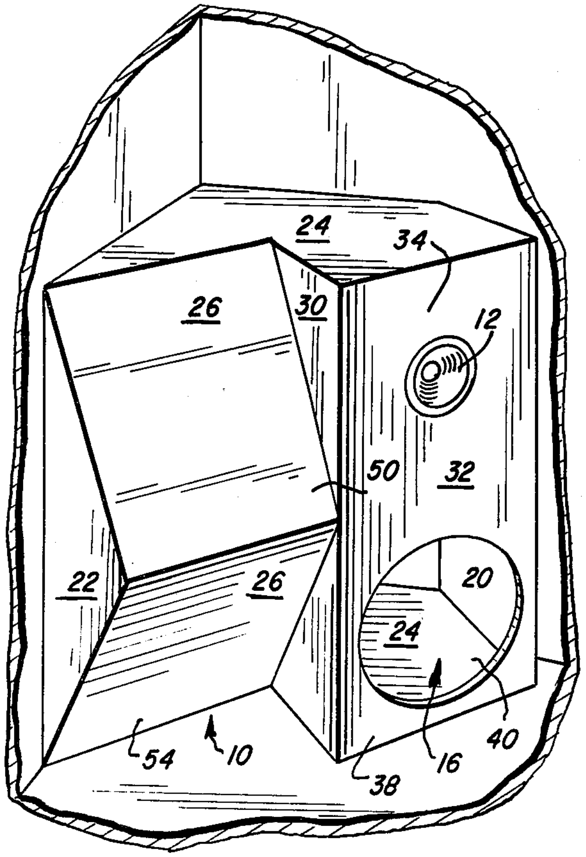
FIG. 8
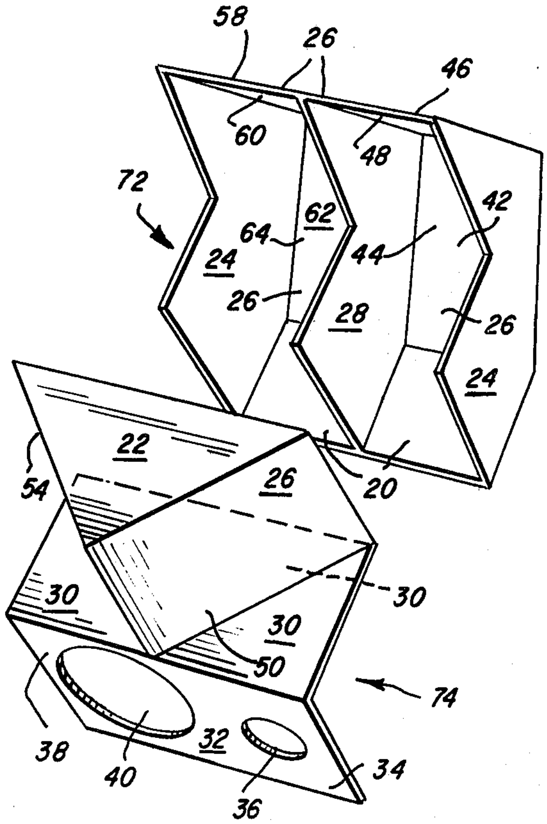
FIG. 7

FOLDED COLUMN SPEAKER ENCLOSURE

FIELD OF THE INVENTION

This invention is directed to sound reproduction equipment and structures and more particularly to loudspeaker enclosures. A loudspeaker enclosure houses the sound-producing speakers and forms a vital part of any sound reproduction system.

BACKGROUND OF THE INVENTION

The loudspeaker enclosure, sometimes called a baffle, plays a critical acoustical role in sound reproduction. The quality and characteristics of the sound actually heard by the listener is influenced to a large extent by the speaker enclosure. Without the loudspeaker enclosure almost all of the low frequency sounds would be lost to the listener and even the best speaker would sound thin and reedy. The reason for this is that both the front and the back surfaces of a conventional cone-shaped speaker emit sound waves as the cone vibrates back and forth. Of course, the cone vibrates in response to the electrical signal received, for example, by the coil in a conventional electro-mechanical speaker. The electrical signal is generated by conventional audio equipment forming part of the total sound reproduction system. When the cone is driven in the forward direction, it compresses the air in front of the cone and causes a partial vacuum behind the cone. Similarly, when the cone vibrates backwards, the reverse occurs. Thus, the sound waves emitted from the front and back surfaces of the cone are always emitted out of phase because the air is compressed on one side and rarefied on the other. If the front wave is permitted to meet the back wave while they are still out of phase, the two waveforms acoustically cancel and no sound is produced. The phenomenon of acoustic cancellation can occur at any frequency, but it is most noticeable at low frequencies.

A major purpose of an enclosure, therefore, is to prevent the acoustic cancellation of sound waves from the front and back of the speaker. There are several different types of speaker enclosures which attempt to eliminate acoustic cancellation. Perhaps the simplest speaker enclosure is the sealed box type. In theory, since the enclosure is sealed, the sound wave which is radiated from the back surface of the speaker cone is totally contained within the enclosure. However, in a conventional rectangular speaker enclosure with the speaker mounted in a plane parallel to the front surface of the enclosure, the sound waves from the back of the cone contact the parallel interior back wall surface of the enclosure and reflect back towards the speaker cone. A portion of the reflected sound waves radiates through the cone causing acoustic cancellation with the sound wave radiated from the front surface of the cone. In some enclosures, to minimize the radiation of reflected sound waves from the back surface of the cone, the enclosure is lined with sound-absorbent material. Another procedure for reducing the effects of the reflected back waves is to change the shape of the enclosure. In a triangular enclosure or an enclosure with angled walls, the sound wave from the back surface of the cone is reflected many times within the enclosure and is substantially diffused. In this way, the reflected waves that eventually radiate from the enclosure are not impluses but are much lower amplitude long pulses which are far less noticeable to the listener.

In another type of enclosure, the sound waves emitted from the back surface of the cone emerge from the enclosure in phase with the low frequency sound waves from the front surface of the cone. An enclosure of this type is the basic transmission-line enclosure which has a substantially rectangular outer structure. Sound wave radiation from the back surface of the cone flows down a conduit filled with low-density sound-absorbing material over a nonlinear path and emerges from a port or opening in the enclosure. Due to the time delay in traveling the conduit path and if the conduit is of sufficient length, the sound waves emerge in phase with the sound waves radiated from the front surface of the cone and do not cancel the rediation from the front of the cone.

A modification of the transmission-line enclosure utilizes vertical partitions within a rectangular enclosure to define a folded conduit with triangular cross-section. The triangular cross-section provides less audible coloration due to diffusing reflections and the sound waves are forced to travel down one triangular column of the conduit and up the next, and so on until they emerge from a port in the enclosure. In this modification of the transmission-line enclosure, small reflectors are placed in the corners of the triangular conduit to assist in directing the sound waves from the back surface of the cone through the conduit path.

Another type of speaker enclosure is the acoustical labyrinth. This enclosure operates on a principle similar to that of the transmission-line enclosure. The labyrinth enclosure comprises an absorbent walled conduit with one end tightly coupled to the back of the cone of the loudspeaker and the other end opening in front or at the bottom of the enclosure within which the conduit is folded. The length of the conduit is such that the radiation from the back of the cone emerges from the enclosure in phase with and additive to the front speaker radiation.

Another type of loudspeaker enclosure is the rectangular column which usually has a plurality of speakers positioned along the front or sides of the enclosure. In the column enclosure, the length of the column determines the level of performance achieved in the low frequency range. The lower the frequencies desired and the larger the speaker unit, the longer the column needs to be.

In each of the mentioned prior art enclosures, and for that matter, in every speaker enclosure, it is critical that the enclosure be constructed of sturdy material and firmly braced to prevent its panels from vibrating, rattling, or radiating sound waves into the listening room. When the enclosure comprises a long folded conduit or a plurality of partitions within a box-like outer enclosure, or when the side panels of a column speaker are quite long, it is difficult and expensive to construct the enclosure so that it is free from rattles and vibration. Naturally, the more complex the enclosure's structure the more expensive it is to manufacture. Also, since the quality of sound reproduction is frequently a function of the distance the sound waves must travel, and therefore the size of the enclosure, whehter it be the length of a folded conduit or the length of a column, the size and shape of the enclosure becomes a practical matter for consideration.

The folded column speaker enclosure of the present invention eliminates many of the problems presented by the above enclosures. It is an object of this invention to provide a sturdy, nonvibrating speaker enclosure that is relatively inexpnsive to construct and assemble because its shape is conducive to a two-piece hard plastic molded construction which can be assembled and positively bonded together with a minimum of bonding surfaces.

Another object of the present invention is to provide a compact enclosure having sound-reproduction capabilities of and a sound wave travel path of equivalent length to a column-type enclosure of greater volume.

Still another object of the present invention is to provide a visually aesthetic enclosure conducive to modular use in a total sound system, wherein the enclosure may be placed in a number of positions and configurations according to visual and audio desires of the listener.

A further object of the invention is to provide an enclosure that emits an additive dual resonant frequency from its port when a mid-range speaker is placed on the folded column substantially midway between the basic speaker and the port.

Other objects and advantages of the invention will become apparent upon reading the following detailed description and appending claims, and upon reference to the accompanying drawings.

SUMMARY OF THE INVENTION

The folded column speaker enclosure of this invention comprises a basic speaker, an enclosed conduit that is folded through several 45° angles upon itself, and a sound wave emission port. The conduit is enclosed by a group of interconnecting panels comprising a bottom panel, a top panel, a pair of side panels, a plurality of sound reflecting panels each having reflecting surfaces, a partition, a shelf and an end panel. The enclosure of this invention may further comprise a mid-range speaker and a high frequency tweeter. The basic speaker is located in the end panel at one end of the enclosed conduit while the port is located in the end panel at the other end. When a mid-range speaker is provided, it is located about midway along the conduit betweem the speaker and the port connected to one of the reflector panels. When a high frequency speaker or tweeter is provided, it is located anywhere within the enclosure or is mounted in association with any frontal exterior surface of the enclosure. When the enclosure is positioned in the preferred attitude for description purposes, the end panel lies in a vertical plane perpendicular to the floor and the bottom panel lies in a horizontal plane parallel to the floor.

An impulse of sound waves emitted from the back surface of the basic speaker travels the length of the conduit and emerges from the port. The impulses of sound from the back surface of the speaker travel seven distinct legs or distances before reaching the port. In the first leg, the sound impulse moves in a horizontal direction relative to the end panel and strikes a first reflector surface which is positioned in a nonvertical plane rotated 45° from the plane of the end panel. Since the angle of incidence of the sound wave is equal to the angle of reflection, the sound wave reflects from the first reflector surface at an angle of 45° and travels vertically upward. The vertical travel of the sound wave is the second leg of the conduit path. The sound wave continues vertically upward until it strikes a second reflector surface which is adjacent and normal to said first reflector surface. The second reflector surface is therefore also at a 45° angle to the end panel. The sound wave strikes the second reflector surface at an angle of 45° and is reflected at that same angle. The sound wave now travels the third leg of the conduit path horizontally in a direction normal to and towards the plane of the end panel until it strikes a third reflector surface. The third reflector surface is in a vertical plane rotated 45° from the plane of the end panel. Upon striking the third reflector surface at an angle of 45°, the sound wave reflects at 45° and continues along the fourth leg of the conduit path horizontally and in a plane parallel to the end panel until it strikes a fourth reflector surface adjacent and normal to said third reflector surface. The fourth reflector surface is in a vertical plane rotated 45° from the plane of the end panel. The sound wave reflects from said fourth reflector surface at a 45° angle and continues along the fifth leg of the conduit path horizontally, but now in a direction normal to and away from the plane of the end panel. The sound wave continues in this manner until it strikes, again at a 45° angle, a fifth reflector surface which is positioned adjacent to and in the same plane as the second reflector surface. The sound wave is reflected at a 45° angle and thus begins traveling vertically downward. The vertical movement of the sound wave along the sixth leg of the conduit path continues until it strikes at a 45° angle, a sixth reflector surface adjacent to and in the same plane as the first reflector surface. The sixth reflector surface is adjacent and normal to the fifth reflector surface. The sound wave is reflected from the sixth reflector surface at 45° and travels along the seventh and final leg of the conduit path horizontally in a direction normal to the end panel and towards the port end of the conduit. The port end of the conduit path is adjacent to and in the same plane as the speaker end. The sound wave emerges from the port and because of the time delay in traveling the path of the conduit, is phase shifted and is therefore generally additive to the sound waves being emitted from the front surface of the speaker. Thus, the total sound quality is enhanced especially in the low frequency range.

When a mid-range speaker is provided, it is positioned centrally in association with the fourth reflector surface in a plane parallel to the plane of the end panel. In this manner, the sound waves emitted from the back of the mid-range speaker travel directly towards the fifth reflector surface and have approximately half the distance to travel compared to sound waves emitted from the back surface of the basic speaker. Thus, the sound waves from the back surface of the mid-range speaker travel a path roughly similar to the fifth, sixth, and seventh legs of the travel path of sound waves from the back surface of the basic speaker. When used, a tweeter may be positioned in a speaker or connected to a frontal portion of the enclosure comprising the end panel and the third and fourth reflector surfaces.

The construction of the present ivention provides many of the advantages of a tall column enclosure within a compact enclosure. For example, an enclosure of this invention having a conduit path of equal length to a column enclosure and a cross-section at the speaker end of the conduit of equal area to a cross-section of the column enclosure has 37½% less volume than that column enclosure. The folded column enclosure of this invention lends itself to relatively inexpensive hard plastic molding construction and assembly. Also, since the folded column enclosure is visually attractive and compact, it adapts very well to modular use for decorative and listening pleasure. The enclosure of this invention has six sides which are capable of acting as a stable base upon which the enclosure will rest without tipping or tilting, therefore, the enclosure positions into numerous attitudes either singly or in combination with other such enclosures. The back portion of the folded column enclosure fits flush in a corner of a room, thus projecting sound substantially diagonally across a room. The back portion of the folded column enclosure also fits flush along the floor at a wall. Because the enclosure or a plurality of enclosures are placeable in so many positions, a listener may experiment with positioning until the desired personal sound blend is achieved.

BRIEF DESCRIPTION OF THE DRAWINGS

For a more complete understanding of this invention, reference should now be made to the embodiments illustrated in greater detail in the accompanying drawings and described below. In the drawings:

FIG. 1 is a perspective view of the folded column enclosure;

FIG. 2 is another perspective view of the folded column enclosure;

FIG. 3 is slightly tilted frontal perspective view of the folded column enclosure;

FIG. 4 is a vertical section of the enclosure along the line 4—4 of FIG. 3 showing arrows which indicate the first portion of the sound travel path;

FIG. 5 is a vertical section of the enclosure along the line 5—5 of FIG. 3 showing arrows which indicate the second portion of the sound travel path;

FIG. 6 is a three-dimensional diagrammatic representation of each leg of the sound wave travel path with the enclosure removed and x, y and z coordinate axes for a frame of reference;

FIG. 7 is an exploded perspective view of the enclosure showing the manner in which it may be two-piece molded;

FIG. 8 is a perspective view of an enclosure in the preferred operating emodiment, disposed in the corner of a room;

DETAILED DESCRIPTION OF THE PREFERRED EMBODIMENTS

Figure 9:
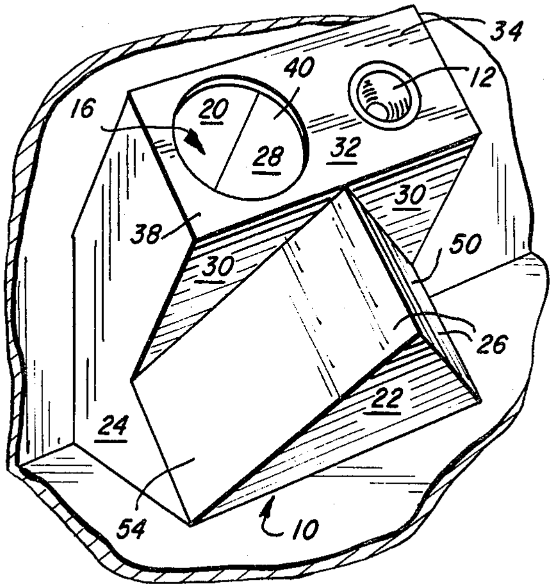
FIG. 9 is a perspective view of an enclosure positioned against a wall.

Referring generally to the drawings, a folded column speaker enclosure 10 may be used singly or in combination with other enclosures 10 for sound reproduction. The speaker enclosure 10 has a basic speaker 12, and enclosed conduit 14 folded through several 45° angles upon itself, and a sound emission port 16 and may further comprise a mid-range speaker 18 and a tweeter (not shown). The conduit 14 is enclosed by a group of interconnecting panels comprising a bottom panel 20, a top panel 22, a pair of side panels 24, a plurality of sound reflecting panels 26, a partition 28, a shelf 30 and an end panel 32. The end panel 32 has a first portion which is a speaker end 34 of said conduit 14 with a speaker opening 36 for receiving said basic speaker 12 and a second portion which is a port end 38 of said conduit 14 with a port opening 40 defining said sound emission port 16.

When the enclosure 10 is positioned in the preferred attitude for descriptive purposes, the end panel 32 lies in a vertical plane perpendicular to the floor and the bottom panel 20 lies in a horizontal plane parallel to the floor. In this attitude, the plurality of reflector panels 26 comprises: a first reflector panel 42 with a first reflector surface 44 which lies in a nonvertical plane rotated at a 45° angle from vertical where the axis of rotation is the line defined by the intersection of the first reflector panel 42 and the bottom panel 20; a second reflector panel 46 with a second reflector surface 48 which lies in a nonvertical plane rotated at a 45° angle from vertical where the axis of rotation is the line defined by the intersection of the second reflector panel 46 and the top panel 22, and the second reflector panel 46 abuts and is normal to the first reflector panel 42; a third reflector panel 50 with a third reflector surface 52 which lies in a vertical plane rotated at a 45° angle from the plane of the end panel 32 where the axis of ratation is a line equidistant from each of the side panels 24 and lying in the plane of the end panel 32; a fourth reflector panel 54 with a fourth reflector surface 56 which is adjacent and normal to the third reflector panel 50 and lies in a vertical plane rotated at a 45° angle from the plane of the end panel 32 where the axis of rotation is a line equidistant from each of the side panels 24 and lying in the plane of the end panel 32; a fifth reflector panel 58 with a fifth reflector surface 60 which is adjacent to and lies in the same plane as the second reflector panel 46; and a sixth reflector panel 62 with a sixth reflector surface 64 which is adjacent to and lies in the same plane as the first reflector panel 42 and abuts and is normal to the fifth reflector panel 58.

When the mid-range speaker 18 is provided, it is located in a hollow member 66 connected to and positioned centrally on the fourth reflector panel 54. When a tweeter is provided it is preferred that it be a closed back tweeter and it is placed facing forward anywhere on the frontal portion of the enclosure 10 comprising the end panel 32, and the third and fourth reflector panels 50 and 54. The tweeter may also be incorporated into the basic speaker 12 or the mid-range speaker 18 if the speakers 12 or 18 are coaxial speakers or the tweeter may even be suspended in said port 16.

Figure 10:
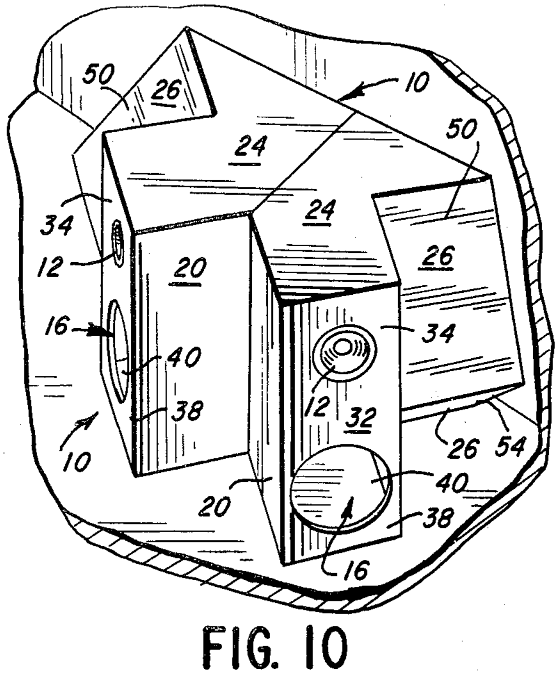
FIG. 10 is a perspective view of a pair of abutting enclosures positioned against a wall showing one configuration in which the enclosures may be placed.
Figure 11:
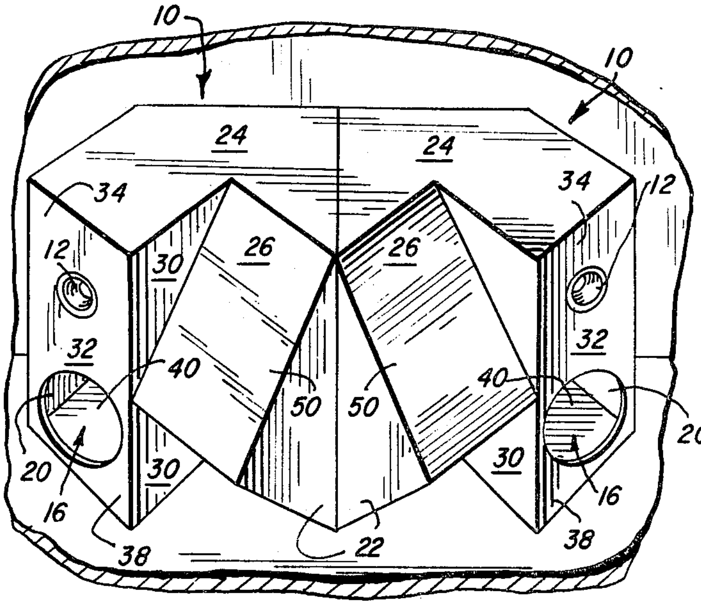
FIG. 11 is another perspective view of a pair of abutting enclosures positioned against a wall and showing another configuration in which the enclosures may be placed.
Figure 12:
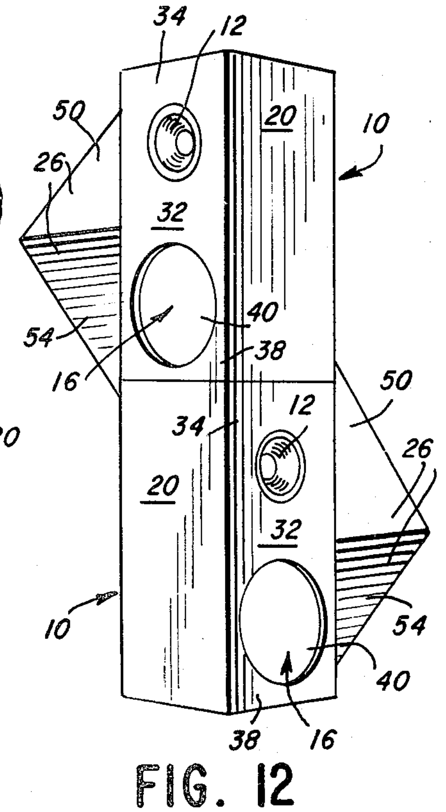
FIG. 12 is an elevational view of a pair of enclosures showing one stacked upon the other.

It is particularly evident from reference to the drawings that the structure of the enclosure 10 of the present invention enables a listener to position one or more enclosures 10 in a variety of configurations according to the listener's visual and audio preferences. Some listeners place enclosures 10 in a room to effectively use the size and shape of the room to enhance their particular listening pleasure. Other listeners place enclosures 10 in a room to compliment the room's decor or to serve some practical purpose. Nonetheless, whatever the listener's preference may be, since the enclosure 10 has six sides capable of acting as a stable base, a listener can position the enclosure 10 without exposing an unsightly back panel and without being subjected to a limited number of positions in which the enclosure 10 operates. The drawings provided illustrate a few of the many positions in which the enclosure 10 operates. For example, FIGS. 1 and 2 show ways in which the enclosure is disposed on a floor. FIG. 8 illustrates a corner placement of the enclosure 10 which is the preferred operating attitude and basically projects the sound emitted diagonally across a room. A rectangular enclosure does not adapt as readily to this position. FIG. 9 shows one way in which the enclosure 10 is placed against a wall, while FIGS. 10 and 11 shows placements for a couple of enclosures 10 against a wall. The enclosures 10, being of sturdy construction, may also be stacked one upon another, as illustrated in FIG. 12.

Although the shape and attractive appearance are decoratively functional, the illustrated embodiments of the enclosure 10 are not limited to this function. The present invention is also concerned with the quality of sound reproduced from the enclosure 10. As mentioned above, the mere fact that the enclosure 10 operates in a variety of positions and combinations increases the possibilities of listening area coverage and sound blends.

In accordance with the invention, one important aspect of the enclosure 10 is its internal operation to produce high quality sound reproduction. Sound waves radiated from the back surface of the basic speaker 12 into the enclosure 10 travel a path constituting seven separate legs or distances defined by the conduit 14 and emerge through the port 16. To simplify the description of the present invention, the preferred attitude for purposes of description of the enclosure 10 is described such that the end panel 32 lies in a vertical plane perpendicular to the floor and the bottom panel 20 lies in a horizontal plane parallel to the floor. Also, the sound waves are treated as a single impulse and are signified in the drawings by arrows.

Referring now to FIGS. 4–6, 14, and 15, a sound impulse radiates from the back surface of the basic speaker 12 and travels horizontally the first leg 43 of the conduit path until it strikes the first reflector surface 44. Since the angle of incidence equals the angle of reflection and the first reflector surface 44 is disposed at 45° of vertical, the impulse will reflect at 45° and begin traveling vertically upward. Although the various portions of the impulse waveform strike the first reflector surface 44 and reflect at different times, because of the uniqueness of 45° reflections, each portion of the impulse travels the same total distance and unites with the other portions of the impulse waveform at the instant the last portion of the impulse is reflected. The impulse continues traveling vertically along the second leg 47 of the conduit path until it strikes the second reflector surface 48 again at an angle of 45° and is reflected at the same angle. This reflection alters the course of the impulse such that the third leg 51 of the conduit path is horizontal in a direction towards and normal to the plane in which the end panel 32 lies. The impulse continues on that course until striking the third reflector surface 52 which lies in a vertical plane rotated 45° from the plane of the end panel 32. The impulse is then reflected at 45° and continues along the fourth leg 55 of the conduit path horizonatally and in a plane parallel to the end panel 32. The impulse eventually strikes the fourth reflector surface 56 as shown in FIG. 4 and continues along the fifth leg 59 of the conduit path as shown in FIG. 5. Thus, the impulse travels horizontally in a path normal to and away from the plane of the end panel 32. The impulse then strikes and reflects from the fifth reflector surface 60 such that the sixth leg 63 of the conduit path is altered to the vertical downward direction. Thereafter, the impulse strikes and reflects from the sixth reflector surface 64 at 45° angles. At the instant of the last reflection of the last portion of the impulse waveform, the last portion of the impulse unites with the other portions of the impulse waveform and travels uniformly along the seventh leg 65 of the conduit path to the port 16, again because of reflections through 45°. Thus, each portion of the impulse waveform travels the same total distance as other portions of the impulse and the impulse emerges from said port 16 basically intact. A three-dimensional diagram of an entire sound impulse travel path within the conduit 14 with each leg thereof clearly designated is illustrated in FIG. 6 with the enclosure 10 removed except for fragments of each of the six reflector surfaces.

Since the impulse has been time delayed due to its travel through the conduit 14, it emerges from the port 16 phase shifted. The extent of the phase shifting depends on the frequency of the sound impulse and the distance it must travel within the conduit. Given a distance of travel, sound waves at certain frequencies will emerge from the port 16 and add to, rather than acoustically cancel the frontal waves emitted from the front surface of said basic speaker 12. This phenomena enhances the sound in certain frequency ranges, and quite noticeably enhances the sound in the lower frequencies.

It has been found that an embodiment with a four inch basic speaker 12 mounted in an enclosure 10 as illustrated in the drawings described above and which will fit within a sixteen inch cube operates quite satisfactorily in the low frequencies. In this preferred embodiment, the end panel is eight inches by sixteen inches and the length of the conduit measures sixty-four inches. Thus, with this embodiment, a sound impulse travels the same distance as it would in a sixty-four inch tall column speaker, but is folded such that it occupies thirty-seven and one-half percent less volume than a sixty-four inch tall column with an eight inch by eight inch columnar cross-section.

In accordance with the invention, an alternative embodiment provides a mid-range speaker 18 also repsonsive to the electrical signal received from conventional audio equipment and emitting sound waves in the middle frequencies. Although the mid-range speaker 18 may be connected to any of the panels of the enclosure 10, it is preferred that it be disposed on a frontal portion of the enclosure 10 when said enclosure 10 is in the preferred descriptive attitude, i.e., on the end panel 32 or the third or fourth reflector panels 50 and 54.

Figure 13:
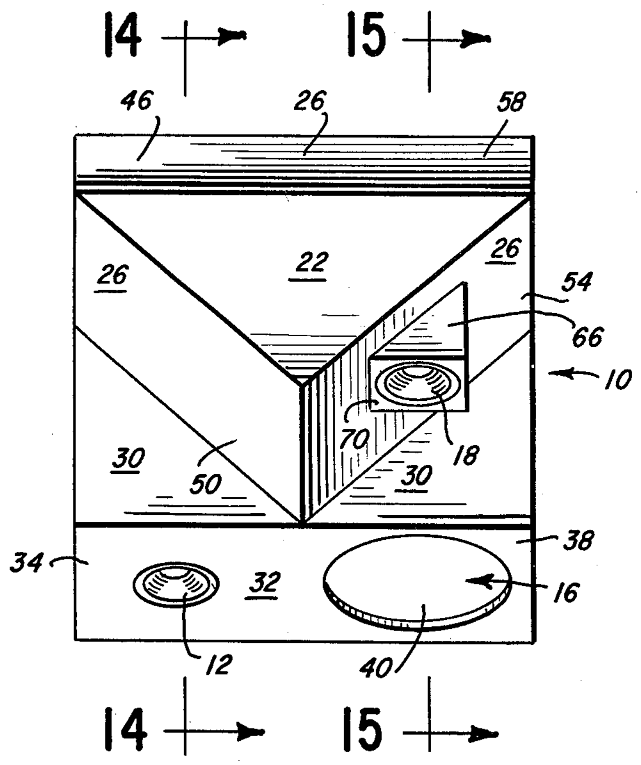
FIG. 13 is a slightly tilted frontal perspective view of another embodiment of the folded column enclosure.
Figure 14:
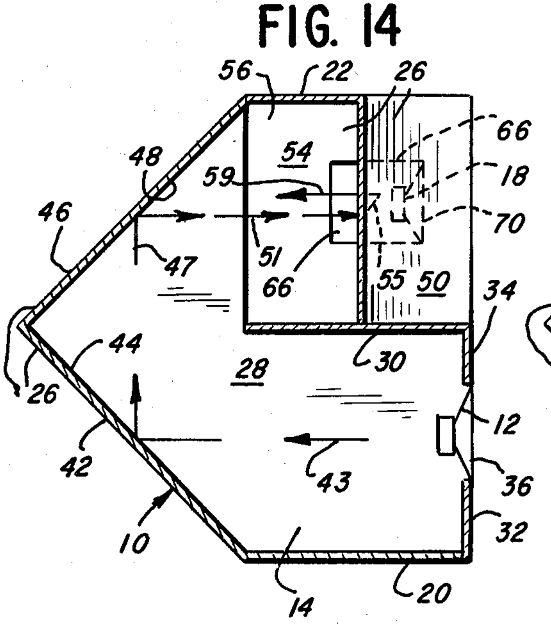
FIG. 14 is a vertical section of the enclosure along the line 14—14 of FIG. 13 showing arrows which indicate the first portion of the sound travel path.
Figure 15:
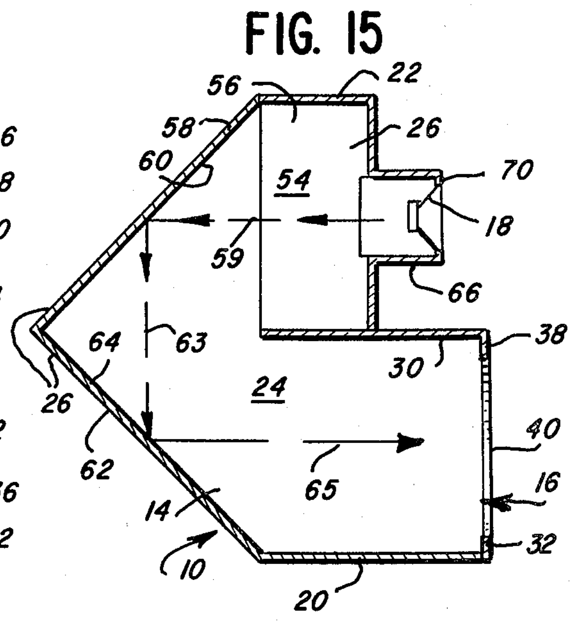
FIG. 15 is a vertical section of the enclosure along the line 15—15 of FIG. 13 showing arrows which indicate the second portion of the sound travel path.

A particularly preferred alternative embodiment applying a mid-range speaker 18 is illustrated in FIGS. 13–15. In this embodiment the fourth reflector panel 54 is provided with a hollow member 66 which extends or recesses in a direction normal to the plane of the end panel 32. The hollow member 66 has a receiving end 70 which lies in a plane parallel to the plane of end panel 32 for receiving the mid-range speaker 18. Thus, the sound waves emitted from the back surface of the mid-range speaker 18 are projected directly towards the fifth reflector panel 58 and unite with sound waves from the back surface of the basic speaker 12 traveling the fifth leg 59 of the conduit path. In this manner, sound waves from the back surface of the mid-range speaker 18 are projected into the sound flow from the back surface of the basic speaker 12 and travel substantially the fifth, sixth, and seventh legs 59, 63, and 65 of the conduit path, a distance approximately one-half the resonant frequency which is emitted from the port 16. This dual resonant frequency, being time delayed because of the travel through conduit 14, is generally additive to the sound waves emitted from the front surface of the speakers 12 and 18, and enhances the total sound emitted from the enclosure 10. The total sound emitted is clean, open, and uncluttered by echoes or noticeable acoustic cancellation. The rich total sound is achieved without the aid of a complex conventional cross-over network for assuring dual resonant frequency. However, utilizing such a cross-over network is contemplated as a more expensive to produce alternative embodiment.

The utilization of a high frequency speaker or tweeter is also contemplated and is achieved in several ways. One embodiment suspends the tweeter in the sound emmission port 16, while another disposes it on a frontal portion of the enclosure 10 when the enclosure 10 is in the preferred descriptive attitude, i.e., connected to the end panel 32 or the third or fourth reflector panels 50 and 54. Other embodiments utilizing a tweeter include incorporating the tweeter into the basic speaker 12 or the mid-range speaker 18 or both by using conventional coaxial speakers.

One of the important features of the invention is that its structure is particularly conducive to a two-piece hard molded plastic construction. As shown in FIG. 7, the enclosure 10 of the present invention is inexpensively formed into two pieces, a back piece 72 comprising the bottom and side panels 20 and 24, the partition 28, and the first, second, fifth, and sixth reflector panels 42, 46, 58, and 62, and a front piece 74 comprising the top and end panels 22 and 32, the shelf 30 and the third and fourth reflector panels 50 and 54. Although the two-piece embodiment described is preferred, it is to be understood that other two-piece configurations may be used and the enclosure 10 may also be constructed of materials, such as wood, and in a different manner than the described two-piece construction. With the two-piece hard plastic construction, the enclosure 10 is constructed with sturdy novibrating panels and the total number of surfaces to be bonded together is minimized thereby minimizing the possibility of loose or rattling attachment.

While particular embodiments of the invention have been shown, it will be understood, of course, that the invention is not limited thereto since modifications may be made by those skilled in the art, particularly in light of the foregoing teachings. It is, therefore, contemplated by the appended claims to cover any such modifications as incorporate those features which constitute the essential features of these improvements within the true spirit and scope of the invention.

What is claimed is:

1. A loudspeaker enclosure device for reducing acoustical cancellation and enhancing the audible sound output connected to a source of audio signal and comprising:

- a basic speaker responsive to said audio signal for emitting sound waves from the front surface of said speaker into a listening area and from the back surface of said speaker into said enclosure;
- a substantially enclosed structure for defining a sound wave conduit, said structure comprising:
  - a bottom panel extending in a horizontal plane substantially parallel to the floor;
  - an end panel connected to said bottom panel and extending in a vertical plane substantially perpendicular to said bottom panel; said end panel having a speaker portion with a speaker opening for receiving said basic speaker and a port portion with a port opening for allowing sound waves emitted from said basic speaker into said structure to emerge from said structure;
  - a top panel extending in a horizontal plane in parallel spaced relation to said bottom panel;
  - a shelf extending in a horizontal plane between and in parallel spaced relation to said bottom and top panels and connected to said end panel;
- a pair of side panels extending in a vertical plane perpendicular to the plane of said end panel and connected to said bottom, top and end panels and said shelf; and,
- a plurality of at least six reflector panels connected to said structure for reflecting and directing the sound waves emitted into said structure from said basic speaker along a wave path through said conduit from said basic speaker to said port opening so that the sound wave emitted from said port opening is phase shifted and additive to the sound wave emitted from the basic speaker into the listening area.

2. A loudspeaker enclosure as set forth in claim 1 further comprising:

- a first reflector panel adjacent said bottom panel and rotated 45° from the plane of said end panel about an axis of rotation defined as the line of intersection of said first reflector panel and said bottom panel;
- a second reflector panel adjacent and normal to said first reflector panel and rotated 45° from the plane of said end panel about an axis of rotation defined as the line of intersection of said second reflector panel and said top panel;
- a third reflector panel adjacent said top panel and lying in a plane normal to said bottom panel, said third reflector panel being rotated 45° from the plane of said end panel about an axis of rotation defined as the line of intersection of said third reflector panel and one of said side panels;
- a fourth reflector panel adjacent and normal to said third reflector panel, said fourth reflector panel is adjacent to said top panel and lying in a plane normal to said bottom panel which is rotated 45° from the plane of said end panel about an axis of rotation defined as the line of intersection of said third and fourth reflector panels;
- a fifth reflector panel adjacent said top and second reflector panels and lying in the same plane as said second reflector panel; and
- a sixth reflector panel adjacent and normal to said fifth reflector panel and adjacent and lying in the same plane as said first reflector panel.

3. A loudspeaker enclosure as set forth in claim 2 further comprising a mid-range speaker responsive to said audio signal for emitting sound waves, said mid-range speaker disposed adjacent one of said reflector panels at a position substantially midway on said wave path between said basic speaker and said port opening.

4. A loudspeaker enclosure as set forth in claim 3 wherein said structure further comprises a hollow member connected to one of said reflector panels for receiving said mid-range speaker and for channeling the sound waves emitted from the back surface of said mid-range speaker into said structure.

5. A loudspeaker enclosure as set forth in claim 4 wherein an end of said hollow member lies in a plane parallel to the plane of said end panel, said end for receiving said mid-range speaker.

6. A loudspeaker enclosure as set forth in claim 2 wherein said structure further comprises a partition extending in a plane between and in parallel spaced relation to said side panels for supporting said shelf and further defining said conduit.

7. A device as set forth in claim 2 or 6 wherein said structure is formed of a first and second molded members.

8. A loudspeaker enclosure as set forth in claim 7 wherein said first member comprises at least said side and bottom panels, and said first, second, fifth, and sixth reflector panels, and said second member comprises at least said end and top panels, shelf, third, and fourth reflector panels.

9. A loudspeaker enclosure as set forth in claim 2 further comprising a frontal portion of said structure defined as comprising the end panel, and said third and fourth reflector panels, and a high-frequency speaker connected to said frontal portion.

* * * * *